United States Patent
Torng et al.

(10) Patent No.: US 7,122,386 B1
(45) Date of Patent: Oct. 17, 2006

(54) METHOD OF FABRICATING CONTACT PAD FOR MAGNETIC RANDOM ACCESS MEMORY

(75) Inventors: Chyu-Jiuh Torng, Pleasanton, CA (US); Tom Zhong, Cupertino, CA (US); Wei Cao, San Jose, CA (US); Po-Kang Wang, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 0 days.

(21) Appl. No.: 11/231,674

(22) Filed: Sep. 21, 2005

(51) Int. Cl.
*H01L 21/00* (2006.01)

(52) U.S. Cl. .................... 438/3; 438/240; 438/E21.665

(58) Field of Classification Search ............ 438/3, 438/240
See application file for complete search history.

(56) References Cited

U.S. PATENT DOCUMENTS

| | | | |
|---|---|---|---|
| 6,709,942 B1 | 3/2004 | Pan et al. | 438/381 |
| 6,806,096 B1 | 10/2004 | Kim et al. | 438/3 |
| 6,912,152 B1 | 6/2005 | Iwata et al. | 365/158 |
| 2003/0168684 A1 | 9/2003 | Pan et al. | 257/296 |
| 2006/0097298 A1* | 5/2006 | Ho | 257/295 |

* cited by examiner

*Primary Examiner*—Quoc Hoang
(74) *Attorney, Agent, or Firm*—Saile Ackerman LLC; Stephen B. Ackerman LLC

(57) ABSTRACT

A method of forming a Cu—Cu junction between a word line pad (WLP) and bit line (BL) contact is described. An opening above a WL contact is formed in a first $SiN_x$ layer on a substrate that includes a WLP and word line. After a bottom electrode (BE) layer, MTJ stack, and hard mask are sequentially deposited, an etch forms an MTJ element above the word line. Another etch forms a BE and exposes the first $SiN_x$ layer above the WLP and bond pad (BP). An MTJ ILD layer is deposited and planarized followed by deposition of a second $SiN_x$ layer and BL ILD layer. Trenches are formed in the BL ILD layer and second $SiN_x$ layer above the WLP, hard mask and BP. After vias are formed in the MTJ ILD and first $SiN_x$ layers above the WLP and BP, Cu deposition follows to form dual damascene BL contacts.

20 Claims, 6 Drawing Sheets

METHOD OF FABRICATING CONTACT PAD FOR MAGNETIC RANDOM ACCESS MEMORY

FIELD OF THE INVENTION

The invention relates to a method of achieving improved electrical performance and reliability in an MRAM array and in particular to improved electrical contact between a bit line pad and word line pad and in a bit line contact region at a bond pad location.

BACKGROUND OF THE INVENTION

Magnetic random access memory (MRAM) that incorporates a magnetic tunnel junction (MTJ) as a memory storage device is a strong candidate to provide a high density, fast (1–30 ns read/write speed), low power, and non-volatile solution for future memory applications. The architecture for MRAM devices is composed of an array of memory cells generally arranged in rows and columns. Each memory cell is comprised of a memory element (MTJ) that is in electrical communication with a transistor through an interconnect stack. The memory elements are programmed by a magnetic field created from pulse current carrying conductors such as copper lines. Typically, two arrays of current carrying conductors that may be called "word lines" and "bit lines" are arranged in a cross point matrix. Normally, the word lines are formed under the MTJs and are isolated from the memory elements by a dielectric layer. The bit lines contact the top portion of the MTJs and are electrically connected to a conductive cap layer. Additionally, there is a bottom electrode that contacts the bottom of each MTJ and electrically connects the MTJ with an underlying transistor.

The MTJ consists of a stack of layers with a configuration in which two ferromagnetic layers are separated by a thin insulating layer such as $AlO_x$ that is called a tunnel barrier layer. One of the ferromagnetic layers is a pinned layer in which the magnetization (magnetic moment) direction is more or less uniform along a preset direction and is fixed by exchange coupling with an adjacent anti-ferromagnetic (AFM) pinning layer. The second ferromagnetic layer is a free layer in which the magnetization direction can be changed by external magnetic fields. The magnetization direction of the free layer may change in response to external magnetic fields which can be generated by passing currents through a bit line and word line as in a write operation. When the magnetization direction of the free layer is parallel to that of the pinned layer, there is a lower resistance for tunneling current across the insulating layer (tunnel barrier) than when the magnetization directions of the free and pinned layers are anti-parallel. The MTJ stores digital information ("0" and "1") as a result of having one of two different magnetic states.

In a read operation, the information is read by sensing the magnetic state (resistance level) of the MTJ through a sensing current flowing through the MTJ, typically in a current perpendicular to plane (CPP) configuration. During a write operation, the information is written to the MTJ by changing the magnetic state to an appropriate one by generating external magnetic fields as a result of applying bit line and word line currents. Cells which are selectively written to are subject to magnetic fields from both a bit line and word line while adjacent cells (half-selected cells) are only exposed to a bit line or a word line field.

As the MTJ size shrinks in order to satisfy higher performance MRAM requirements, the interconnects within the MRAM structure also decrease in size to conform to electrical requirements and space restrictions for high density designs. There is also a greater demand on reliability of the MRAM device since reduced interconnect sizes usually lead to a greater chance of device failure at contact points between adjacent metal layers. For example, the junction between a bit line pad and word line pad, and the bit line contact region at a bond pad site often show very high contact resistance and reliability issues that degrade device performance. Therefore, an improved method of fabricating metal interconnects within an MRAM structure is needed, especially where a bit line pad contacts a word line pad and at bit line contacts to bond pad areas.

In U.S. Pat. No. 6,806,096, an integration scheme is disclosed whereby a buffer insulating layer is deposited over an MTJ stack and conductive hard mask to protect these elements during a damascene process that forms interconnects to first conductive lines. However, the need to improve the electrical connection between a bit line pad and word line pad is not addressed.

U.S. Pat. No. 6,709,942 and related Patent Application Publication 2003/0168684 describe a method of fabricating MRAM devices by employing a dual damascene process that involves forming a bit line that contacts a free layer in an MTJ. Again, bit line to word line contact issues are not discussed.

U.S. Pat. No. 6,912,152 discloses a method whereby read word lines are formed below an MTJ and write bit lines are disposed above the MTJ by a damascene process.

SUMMARY OF THE INVENTION

One objective of the present invention is to provide a dual damascene approach for bit line contacts to word line pads and for bit line contact to bonding pad regions in an MRAM structure.

A second objective of the present invention is to provide improved electrical performance and reliability in MRAM devices.

In accordance with the present invention, a substructure is provided for an MRAM array that includes metal layers, insulating layers, and transistors arranged in a conventional configuration on a semiconductor substrate. On the substructure is formed a first interlevel dielectric layer (ILD) such as fluorosilicate glass (FSG). For each memory cell in the MRAM array, there are vias formed in the FSG layer that connect an overlying word line pad and word line contact to a metal layer in the substructure. In one embodiment, the vias (V3) are used to connect to an underlying third level metal (M3) layer. The word line pad (WLP), word line contact (WLC), and a word line which are preferably comprised of Cu are formed in and are coplanar with a word line ILD layer disposed on the FSG layer.

In the exemplary embodiment, a first SiNx layer is deposited on the word line ILD layer, WLP, WLC, and word line. A first photoresist patterning and etching sequence is employed to open a word line via (WLV) in the first SiNx layer above the WLC. Once the first photoresist layer is removed, a bottom electrode (BE) layer, an MTJ stack of layers, and a Ta hard mask are sequentially deposited on the first SiNx layer. Next, a second photoresist patterning and etch sequence is followed to remove the hard mask and MTJ stack except above the word line and thereby form an MTJ element with overlying hard mask. The second photoresist layer is stripped and then a third photoresist patterning and etch sequence is used to form an opening in the BE layer above the WLP and above a bonding pad region. After the third photoresist layer is removed, an MTJ ILD layer is deposited followed by a CMP process that stops on the hard mask layer. Thereafter, a second SiNx layer and a bit line ILD layer are sequentially deposited on the MTJ ILD and hard mask. A fourth photoresist patterning and etch sequence is employed to open trenches above the WLP, MTJ element, and bond pad region. Once the fourth photoresist layer is removed, a fifth photoresist patterning and etch sequence is followed to form a bit line via that contacts the WLP and a second via that contacts the bonding pad region. After the fifth photoresist layer is stripped, a diffusion barrier and copper seed layer are deposited on the sidewalls and bottoms of the trenches and vias. Next, a second CMP process is used to make the diffusion barrier and Cu seed layer coplanar with the bit line ILD layer. The final steps in the process flow involve Cu deposition to fill the vias and trenches and then a third CMP process to planarize the Cu layer with the bit line ILD layer. As a result, a bit line is formed on the hard mask above the MTJ and a bit line pad directly contacts the word line pad to provide improved electrical performance and reliability.

DETAILED DESCRIPTION OF THE INVENTION

Figure 1:
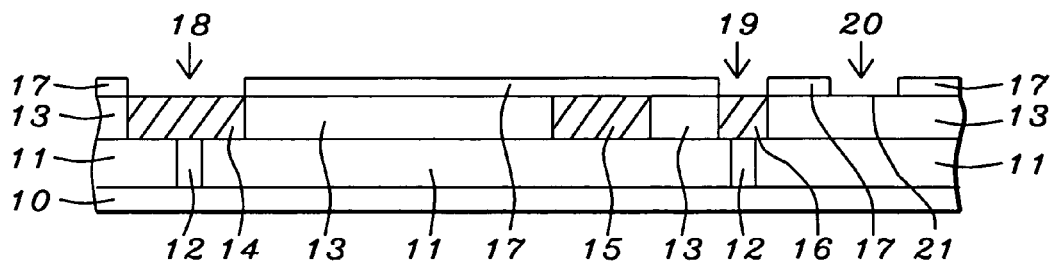
FIGS. 1–5 are cross-sectional views showing a process sequence of forming a bit line pad above a word line pad and a bit line contact in a bond pad region as previously practiced by the inventors.

The present invention is a method of fabricating an MRAM device having improved electrical performance and reliability, especially at bit line pad contacts to word line pads and at bit line contact to bonding pad locations. The drawings are provided by way of example and are not intended to limit the scope of the invention. Although only one MTJ element and one memory cell is depicted in the drawings, it should be understood that there are a plurality of MTJs in an MRAM array that has multiple rows and columns of memory cells on a chip. The MTJ element may have a top spin valve, bottom spin valve, or multi-layer spin valve configuration as understood by those skilled in the art. The exemplary embodiments depict a 1T1 MTJ architecture wherein a bit line is the top conductor line and the bottom electrodes are patterned conductor pads connected to an underlying selection transistor (not shown). Word lines are separated by an interlevel dielectric (ILD) layer from other conductive elements and are aligned beneath the bottom electrode at MTJ locations.

The inventors have previously known a fabrication method depicted in FIGS. 1–5. This process sequence will be described first in order to point out features that lead to reliability issues and a lower electrical performance than desired. Several of the steps in the original process flow (FIGS. 1–5) will be incorporated in the improved fabrication method to be described in a later section.

Referring to FIG. 1, a partially formed MRAM structure is shown that has a substructure 10 comprised of metal layers, insulating layers, transistors, and other devices not shown in order to simplify the drawing. There is a first interlevel dielectric (ILD) layer 11 formed on the substructure 10. In one embodiment, the first ILD layer 11 is made of FSG and is disposed on a substructure 10 that has an exposed third metal level (M3) formed therein. There are vias (V3) 12 formed in the first ILD layer 11 that connect the M3 layer to overlying word line pad 14 and word line contact (WLC) 16.

Figure 13:
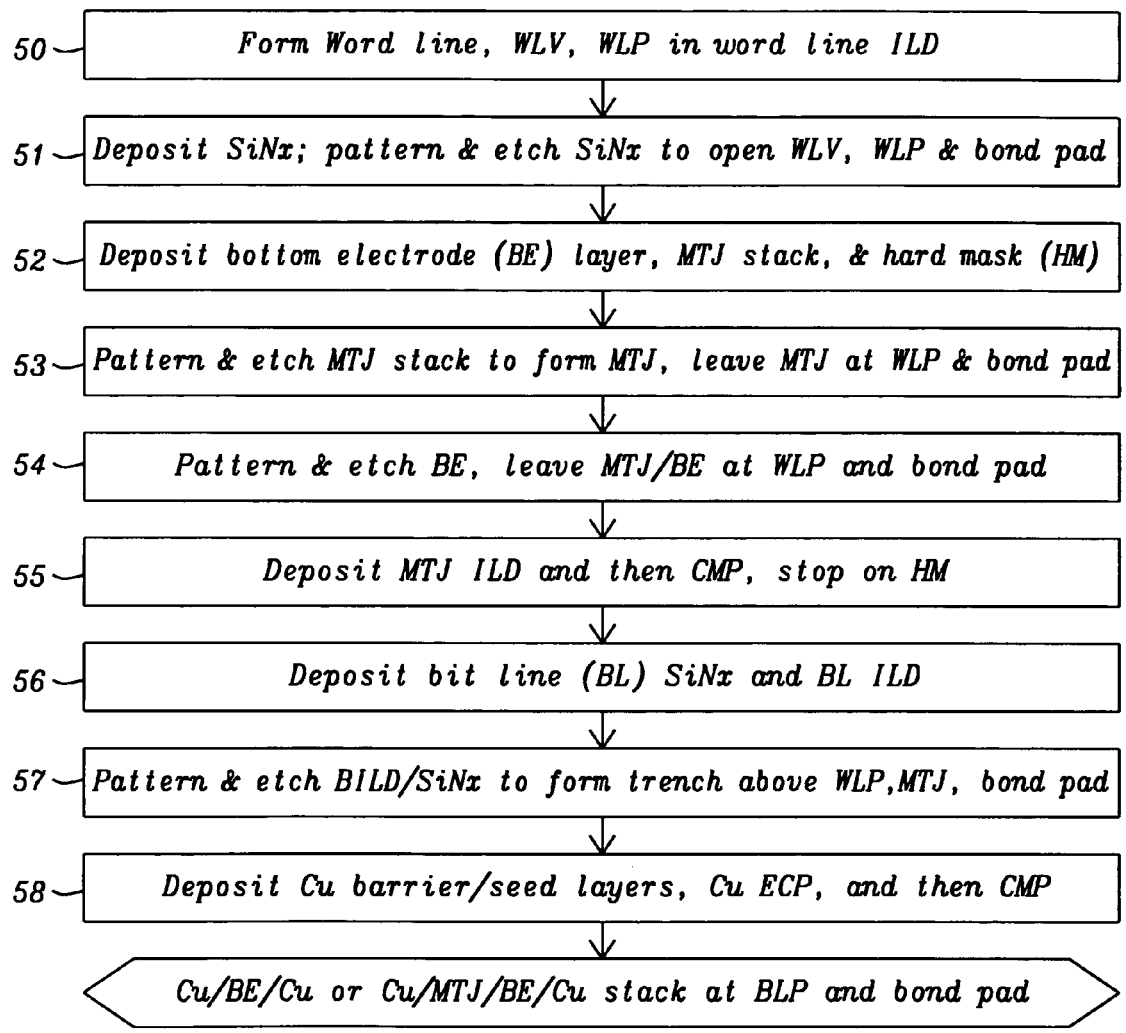
FIG. 13 is a flow diagram showing an MRAM fabrication sequence previously practiced by the inventors and FIG. 14 is a flow diagram showing an improved fabrication sequence according to the present invention.

The original process flow practiced by the inventors is depicted in FIG. 13 and is comprised of steps 50–58. According to one embodiment that begins with step 50, a word line ILD layer 13 is deposited on a first ILD layer 11 and vias 12 (FIG. 1). The word line ILD layer 13 and subsequent ILD layers described herein may be comprised of silicon oxide or a low k dielectric material as understood by those skilled in the art. A conventional patterning, etching, metal deposition, and planarization sequence is employed to form a word line pad (WLP) 14, word line 15, and WLC 16 in the ILD layer 13. Typically, the metal is Cu and a CMP process is needed to make the WLP 14, word line 15, and WLC 16 coplanar with the word line ILD layer 13.

In step 51 (also represented in FIG. 1), a first etch stop layer 17 that is preferably silicon nitride (SiN$_x$) is deposited on the word line ILD layer 13, WLP 14, word line 15, and WLC 16 by a chemical vapor deposition (CVD), physical vapor deposition (PVD), or the like. Alternatively, the first etch stop layer may be silicon oxynitride or another etch stop material known to those skilled in the art. A standard photoresist patterning and etch sequence is used to form an opening 18 over the WLP 14, an opening 19 above the WLC 16, and an opening 20 in a bond pad area 21. Note that the widths of the openings 18, 19, 20 and other elements in the drawings are not necessarily drawn to scale. Once the etch process is completed, the photoresist layer (not shown) is removed by a conventional stripping process.

Figure 2:
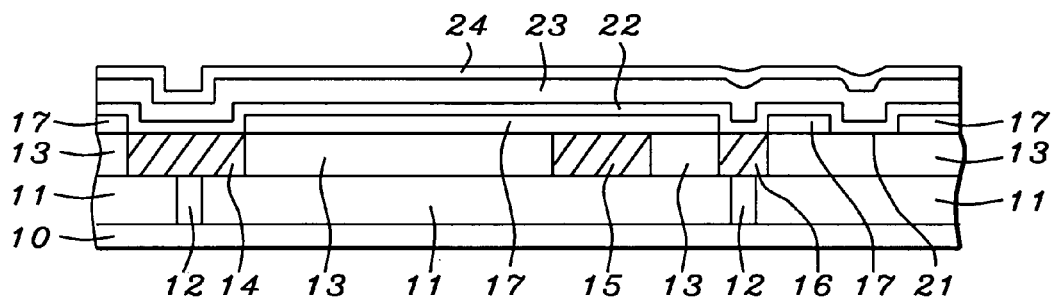

Referring to FIG. 2 (and step 52), a bottom electrode (BE) layer 22, an MTJ stack of layers 23, and a hard mask 24 are sequentially deposited on the first etch stop layer 17 and in the openings 18, 19, 20. Preferably, a sputter deposition system such as an Anelva 7100 system is used to deposit the BE layer 22, MTJ stack 23, and hard mask 24. A low pressure sputter deposition process is advantageously used to form more uniform layers that promote a higher magnetoresistive ratio in the MTJ element to be formed in a subsequent step. The layers 22–24 tend to be conformal and are not usually planar, especially near the openings 18, 19, 20. The present invention encompasses a wide variety of materials and configurations for the BE layer 22 and MTJ stack 23 as appreciated by those skilled in the art. However, the hard mask 24 is preferably a Ta layer having a thickness of about 200 to 500 Angstroms.

Figure 3:
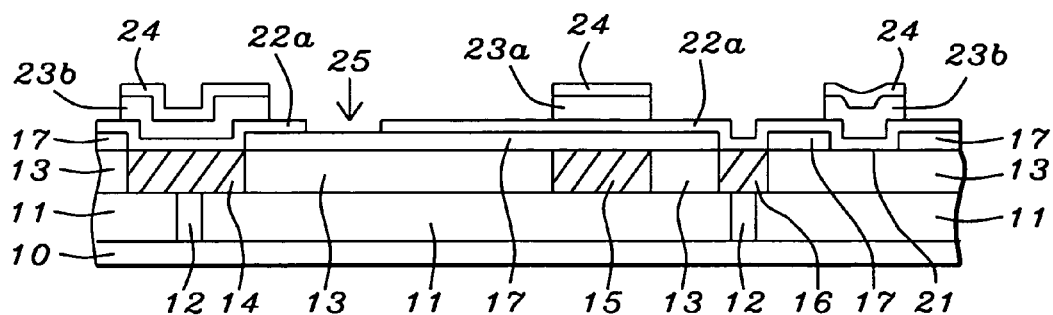

Referring to FIG. 3 (and step 53), a second photoresist layer (not shown) is coated on the hard mask 24 and patterned to serve as an etch mask while selected portions of the hard mask 24 and MTJ stack 23 are removed. For example, an ion beam etch (IBE) may be used to form an MTJ element 23a with overlying hard mask 24 above the word line 15. Additionally, an MTJ stack 23b remains in the opening 18 and above the WLP 14, and in the opening 20 and above the bond pad region 21. After the second photoresist layer is removed, a third photoresist layer (not shown) is coated on the hard mask 24 and BE layer 22 followed by patterning and etching to remove selected portions of the BE layer and thereby form an opening 25 in step 54. The third photoresist layer is stripped after the opening 25 is formed. In one aspect, the opening 25 forms rectangular shaped bottom electrodes 22a under each memory element from a top-down perspective. A bottom electrode 22a connects each MTJ element 23a with a WLC 16 and an underlying transistor (not shown). Note that the bottom electrode 22a remains underneath the MTJ stack 23b and extends over the first etch stop layer 17 in certain regions not covered by the MTJ element 23a or MTJ stack 23b.

Figure 4:
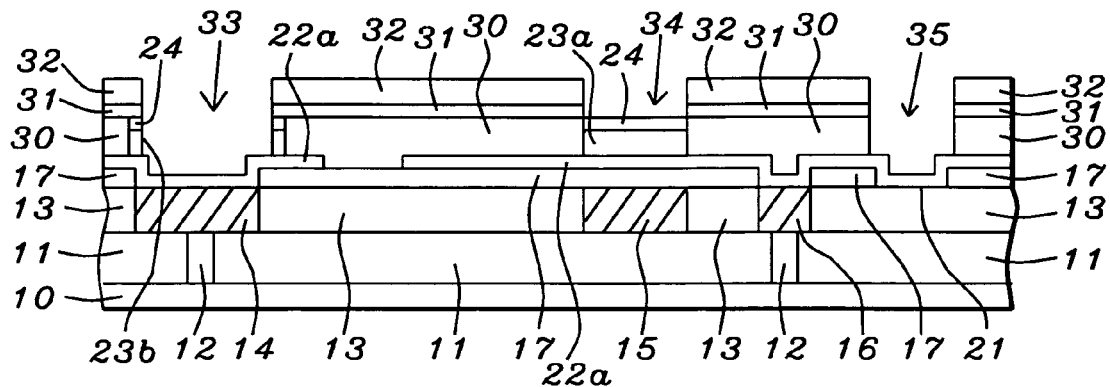

Referring to FIG. 4 (and step 55), an MTJ ILD layer 30 is deposited on the hard mask 24 and bottom electrode 22a to a level substantially above the MTJ 23a. Then a CMP process is performed that stops on the hard mask 24 and leaves the MTJ ILD layer 30 coplanar with the hard mask. Next, in step 56, a second etch stop layer 31 that is preferably $SiN_x$ and a bit line ILD layer 32 are sequentially deposited by a CVD or PVD method, for example. A fourth photoresist layer is coated on the ILD layer 32 followed by patterning and etching in step 57 to form a trench 33 in the second etch stop layer 31 and bit line ILD layer 32 above the WLP 14, a trench 34 above the MTJ 23a, and a trench 35 above the bond pad region 21. At this point the fourth photoresist layer (not shown) is removed by a conventional method.

Figure 5:
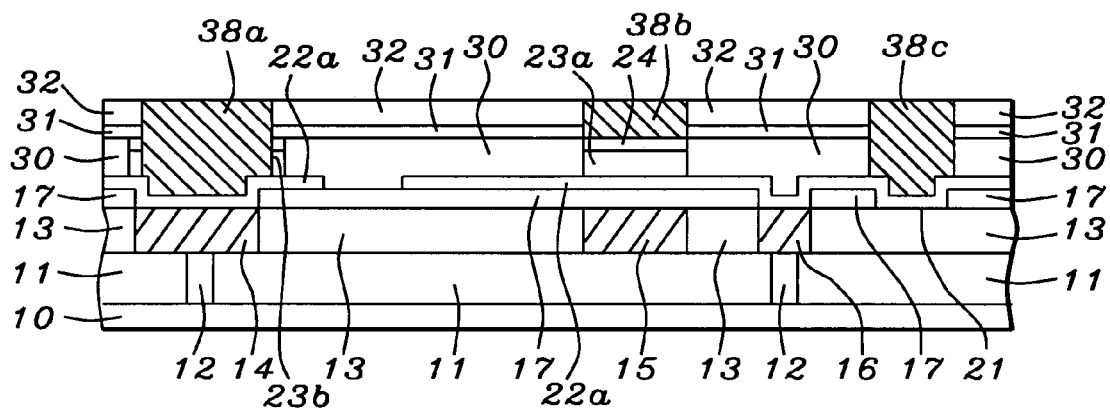

Referring to FIG. 5 (and step 58), a single damascene process is performed in which a diffusion barrier layer and Cu seed layer (not shown) are deposited by a conventional method on the bit line ILD layer 32 and on the sidewalls and bottoms of the trenches 33, 34, 35. Thereafter, a Cu layer is deposited preferably by an electroplating (ECP) method to fill the trenches. A CMP process is then followed to remove the diffusion barrier layer and Cu seed layer (not shown) as well as the Cu layer on the ILD layer 32. As a result, a bit line contact comprised of a single damascene Cu structure 38a is formed that fills the trench 33 and a bit line contact comprised of a single damascene Cu structure 38c fills the trench 35 at the bond pad region 21. Moreover, a bit line 38b is formed above the MTJ 23a and hard mask 24 in trench 34.

Unfortunately, the configuration shown in FIG. 5 where a bottom electrode 22a (or bottom electrode and a portion of MTJ stack 23b) separates the WLP 14 and bit line contact 38a leads to reliability and electrical performance issues in high density MRAM applications. In particular, there is a high contact resistance issue.

Figure 14:
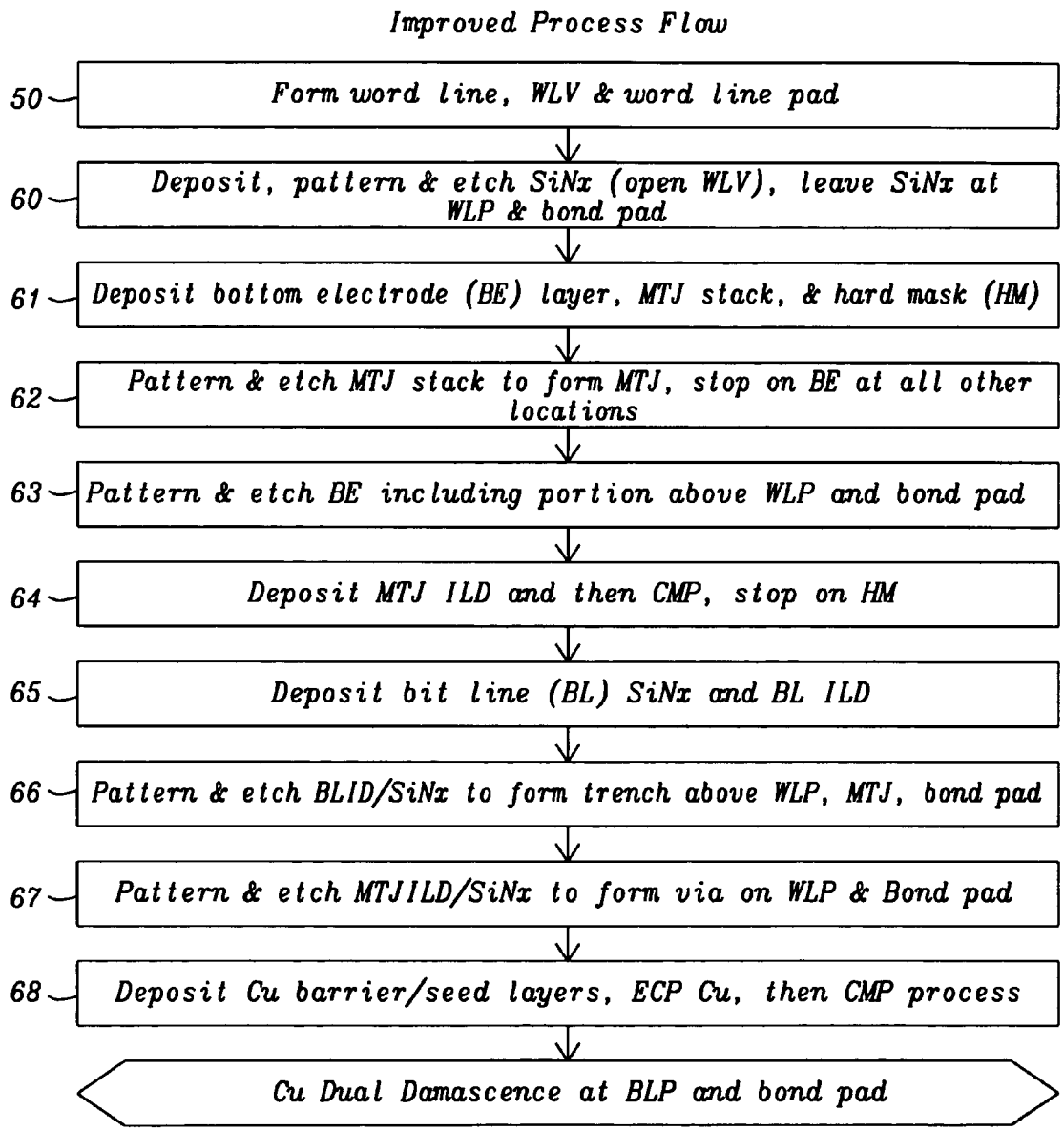

The inventors have discovered an improved process flow that results in direct Cu to Cu contact between the bit line contact and word line pad and leads to improved performance to satisfy the requirements of certain advanced technology MRAM devices. The novel fabrication sequence is depicted in FIGS. 6–12 and is also represented by the process flow diagram in FIG. 14 that comprises step 50 and steps 60 to 68. Step 50 is followed as in the original process flow to form a word line 15, WLP 14, and WLV 16 in a word line ILD layer 13 as previously described.

Figure 6:
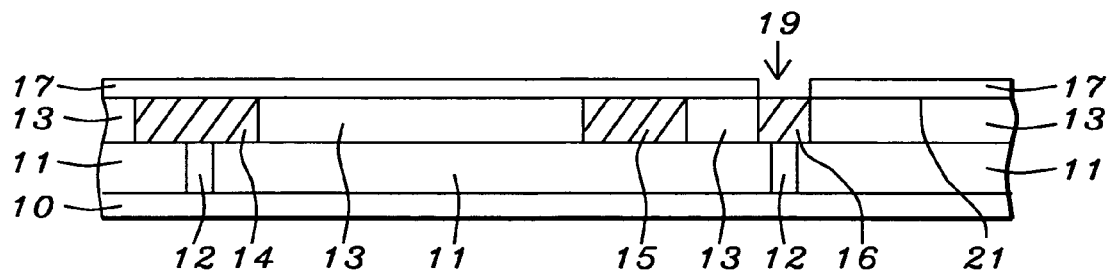
FIG. 6 is a cross-sectional view that depicts a partially formed MRAM structure having a word line pad, word line, word line contact, and bond pad region with an opening formed above the word line contact in a SiNx layer according to one embodiment of the present invention.

Referring to FIG. 6 (and step 60), the first etch stop layer 17 is deposited as in step 51. However, a first photoresist patterning and etch sequence forms only an opening 19 above the WLC 16. An opening 18 above the WLP 14 and an opening 20 above the bond pad region 21 are not included here. The first photoresist layer is stripped following the etch process to complete step 60. Optionally, a conventional cleaning process may be inserted after the photoresist strip to remove any organic residues.

Figure 7:
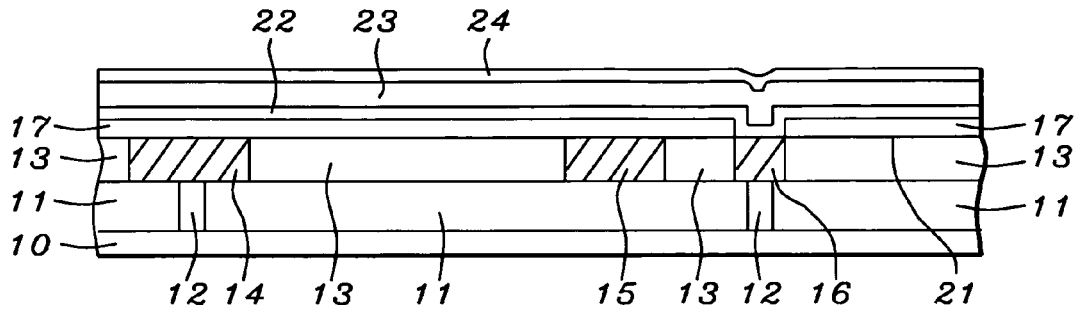
FIG. 7 is a cross-sectional view of the MRAM structure in FIG. 6 after a bottom electrode layer, MTJ stack, and hard mask are successively formed on the SiNx layer.

Referring to FIG. 7 (and step 61), a bottom electrode layer 22, MTJ stack 23, and hard mask 24 are sequentially deposited on the first etch stop layer 17 as described earlier with respect to step 52. However, in this embodiment, the resulting layers 22, 23, 24 are essentially planar above the WLP 14 and bond pad region 21 because of the absence of openings 18, 20.

Figure 8:
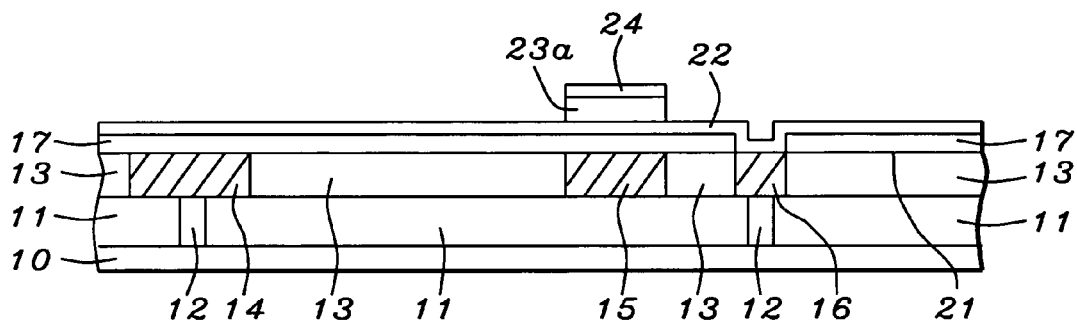
FIG. 8 is a cross-sectional view of the MRAM structure in FIG. 7 after the hard mask and MTJ stack are etched to form an MTJ element and hard mask above the word line.

Referring to FIG. 8 (and step 62), a second photoresist patterning and etching sequence is used to remove selected portions of the hard mask 24 and MTJ stack 23 to leave an MTJ element 23a and overlying hard mask 24 above the word line 15. Unlike the original process flow, the MTJ stack and hard mask are removed above the WLP 14 and bonding pad region 21. The second photoresist layer (not shown) is removed after the etch process is complete at the end of step 62.

Figure 9:
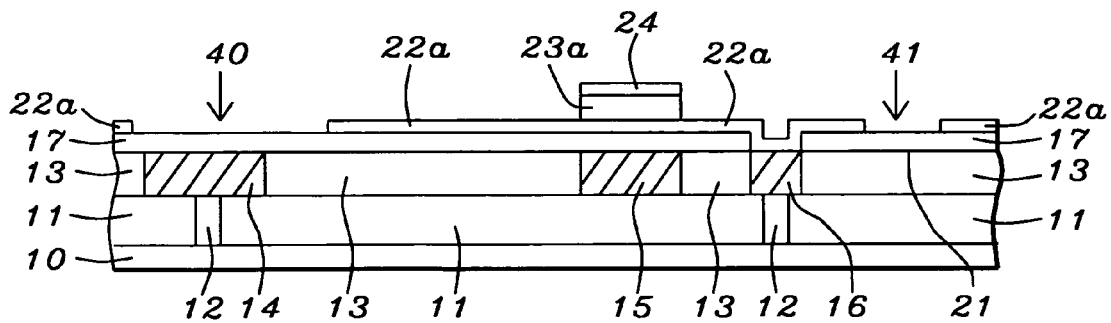
FIG. 9 is a cross-sectional view of the MRAM structure in FIG. 8 after the bottom electrode layer is etched to form an opening above the word line pad and an opening above the bond pad region.

Referring to FIG. 9 (and step 63), a key step is performed in which a third photoresist patterning and etch sequence is employed to selectively remove a portion of the bottom electrode layer 22 above the WLP 14 and adjacent first etch stop layer 17 and over the first etch stop layer 17 at the bond pad region 21. An opening 40 is formed above the WLP 14 and an opening 41 is formed above the bond pad region 21. The etch chemistry and process conditions depend on the composition of the bottom electrode layer as appreciated by those skilled in the art and result in a rectangular shaped bottom electrode 22a under each memory element from a top-down perspective (not shown). In an embodiment where the MTJ element 23a has an elliptical, eye, rectangular, or diamond shape to generate shape anisotropy, the lengthwise direction of the bottom electrode 22a is preferably aligned parallel to the long axis of the MTJ element. The third photoresist layer (not shown) is removed at the end of step 63.

Figure 10:
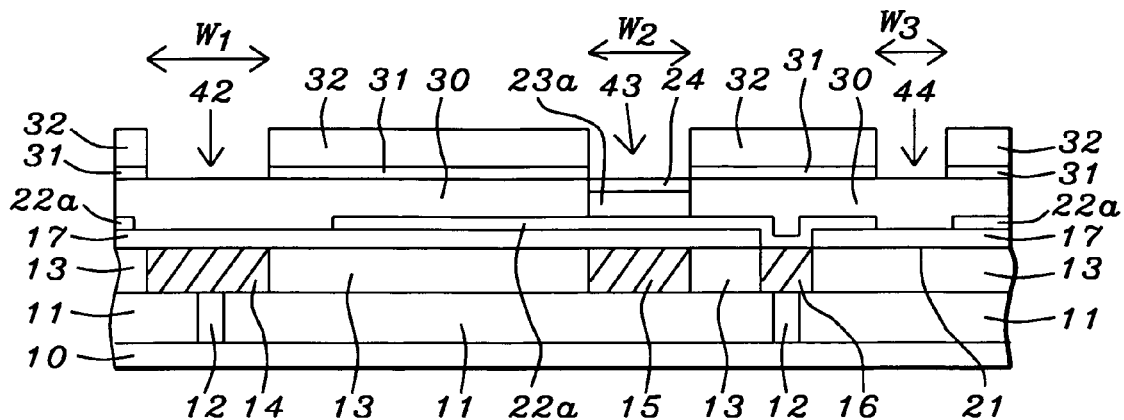
FIG. 10 is a cross-sectional view of the MRAM structure in FIG. 9 following the successive deposition of a MTJ ILD layer, second SiNx layer, and bit line ILD layer and then etching to form trenches in the bit line ILD and second SiNx layer above the word line pad, MTJ element, and bond pad region.

Referring to FIG. 10 (and step 64), an MTJ ILD layer 30 is deposited on the bottom electrode 22a, first etch stop layer 17, and hard mask 24 followed by a CMP process that stops on the hard mask as described previously. Thereafter, in step 65, a second etch stop layer 31 and bit line ILD layer 32 are sequentially deposited on the MTJ ILD layer 30. Note that the MTJ ILD layer 30 is disposed directly on the first etch stop layer 17 above the WLP 14 and bonding pad region 21. The MRAM structure in FIG. 10 is a simpler design that is more easily manufacturable than the intermediate MRAM structure shown in FIG. 4 of the original process flow where an MTJ stack 23b and bottom electrode 22a were also positioned above the WLP 14 and bonding pad region 21.

In step 66, a fourth photoresist layer (not shown) is patterned and serves as an etch mask during an etch that selectively remove portions of the bit line ILD layer 32 and second etch stop layer 31 above the WLP 14, hard mask 24, and bonding pad region 21 and thereby generate trenches 42, 43, and 44, respectively. In one embodiment, the width $w_1$ of trench 42 is about equal to or larger than the width of WLP 14, the width $w_2$ is about equal to or larger than the width of the MTJ element 23a, and the width $w_3$ is about equal to or larger than the width of the bond pad region 21. The trenches 42, 44 expose portions of the MTJ ILD layer 30 and the trench 43 exposes the hard mask 24. The fourth photoresist layer is removed at the end of step 66.

Figure 11:
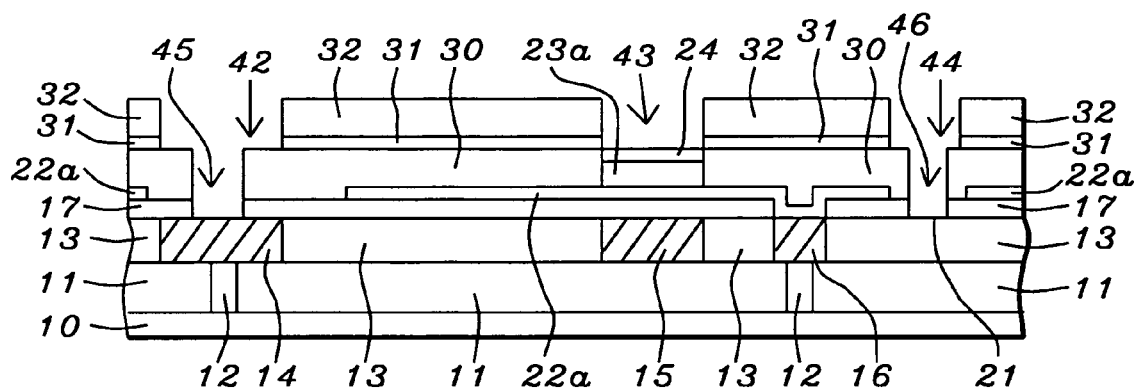
FIG. 11 is a cross-sectional view of a MRAM structure in FIG. 10 after a via is formed in the MTJ ILD above the word line pad and above the bond pad region.

Referring to FIG. 11 (and step 67), a fifth photoresist layer (not shown) is coated on the bit line ILD layer 32 and patterned to serve as an etch mask while an etch process selectively remove portions of the MTJ ILD layer 30 and first etch stop layer 17 and thereby forms a via 45 that exposes a portion of WLP 14 below the trench 42 and a via 46 that exposes a portion of the bond pad region 21 below the trench 44. The hard mask 24 protects the MTJ element 23a during the via etch process. The fifth photoresist layer is removed after vias 45, 46 are formed.

Figure 12:
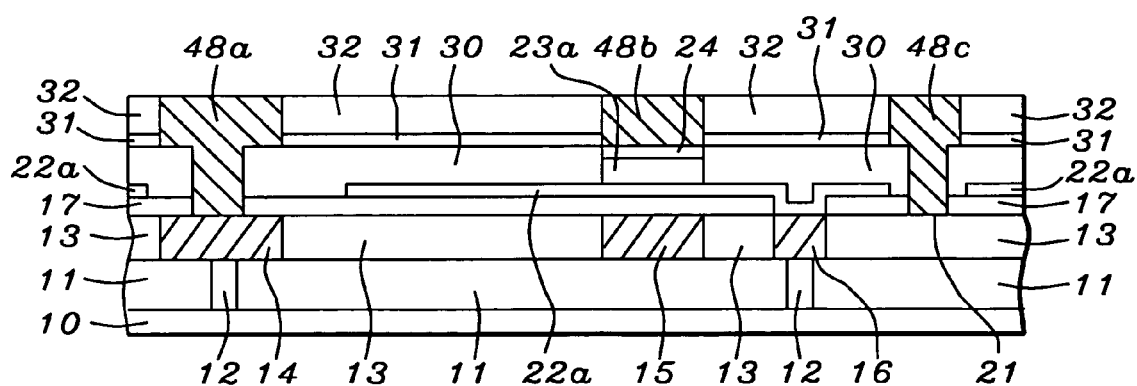
FIG. 12 shows the completed MRAM structure following deposition of a metal layer to fill the vias and trenches in FIG. 11 and then a chemical mechanical polish (CMP) process to make the metal layer coplanar with the bit line ILD layer.

Referring to FIG. 12 (and step 68), a bit line contact 48a that is a Cu dual damascene structure is formed on WLP 14 and a bit line contact 48c that is a Cu dual damascene structure is formed that contacts bonding pad region 21. In addition, a bit line 48b is formed on the hard mask 24. Step 68 involves the same process sequence as previously described with respect to step 58 in the original process flow. In other words, a diffusion barrier layer and Cu seed layer (not shown) are deposited on the sidewalls and bottoms of vias 45, 46 and trenches 43, 44, 45 and then a Cu ECP process is preferably performed to fill the aforementioned vias and trenches. A CMP process is then employed for planarization of the bit line 48b and bit line contacts 48a, 48c.

The MRAM structure depicted in FIG. 12 provides several advantages over the MRAM structure in FIG. 5 that was fabricated by the original process flow. First of all, there is substantially lower contact resistance between WLP 14 and bit line contact 48a than between WLP 14 and bit line contact 38a because of the Cu—Cu junction established between WLP 14 and bit line contact 48a. Reliability is also improved due to the Cu—Cu junction where the bit line contact 48a interfaces with the word line pad. In particular, Cu—Cu bonding in FIG. 12 is believed to be stronger and more resistant to failure than in prior art configurations such as FIG. 5 where a bottom electrode (or bottom electrode and a portion of the MTJ stack) separates the Cu layers. Thus, electromigration and stress migration performance are improved. Furthermore, a higher fabrication yield is expected with the improved process flow because of wider process margins that result from eliminating the MTJ/BE patterned sections over the word line pad and bonding pad region.

While this invention has been particularly shown and described with reference to, the preferred embodiment thereof, it will be understood by those skilled in the art that various changes in form and details may be made without departing from the spirit and scope of this invention.

We claim:

1. A method of forming bit line contacts in an MRAM structure, comprising:

(a) providing a substrate comprised of a word line, word line pad, word line contact, and word line interlayer dielectric (ILD) layer that are coplanar;

(b) depositing a first etch stop layer on the substrate and forming an opening in said first etch stop layer that exposes the word line contact;

(c) sequentially depositing a bottom electrode layer, MTJ stack, and hard mask on the first etch stop layer and exposed portion of the word line contact;

(d) selectively removing portions of the hard mask and MTJ stack to form an MTJ element and overlying hard mask that are aligned above the word line;

(e) selectively removing portions of the bottom electrode layer to form an opening directly above the word line pad and directly above a bonding pad region thereby forming a bottom electrode below the MTJ element and on said word line contact;

(f) sequentially forming an MTJ ILD layer, second etch stop layer, and bit line ILD layer on the bottom electrode, hard mask, and first etch stop layer;

(g) forming a first trench in the second etch stop layer and bit line ILD layer above the word line pad, a second trench that exposes the hard mask on the MTJ element, a third trench above the bond pad region, and forming a via between the word line pad and first trench and between the bonding pad region and third trench; and (h) forming a bit line above the MTJ element, a bit line contact comprised of a dual damascene structure in the first trench and via above the word line pad, and a bit line contact comprised of a dual damascene structure in the third trench and via above the bonding pad region.

2. The method of claim 1 wherein the first etch stop layer and second etch stop layer are comprised of silicon nitride ($SiN_x$).

3. The method of claim 1 wherein the bottom electrode, MTJ stack, and hard mask are formed in a sputter deposition system.

4. The method of claim 1 wherein the hard mask is comprised of Ta.

5. The method of claim 1 wherein the MTJ element has shape anisotropy and a long axis and the bottom electrode has a rectangular shape with a lengthwise direction parallel to said long axis.

6. The method of claim 1 wherein the MTJ ILD layer is coplanar with said hard mask.

7. The method of claim 1 wherein the trenches and vias have sidewalls and bottoms and step (h) comprises the sequential deposition of a diffusion barrier layer and Cu seed layer on the sidewalls and bottoms of the vias and trenches and then a Cu ECP deposition to fill the vias and trenches.

8. The method of claim 7 further comprised of a chemical mechanical polish (CMP) process after the Cu ECP deposition to remove the diffusion barrier layer and Cu layer above the bit line ILD layer and thereby form Cu dual damascene structures that are coplanar with the bit line ILD layer.

9. The method of claim 1 wherein portions of the hard mask, bottom electrode layer, and MTJ stack are selectively removed by ion beam etching.

10. The method of claim 1 wherein the word line pad, word line, and word line contact are comprised of Cu and a Cu—Cu junction is established between the word line pad and bit line contact.

11. A method of forming bit line contacts in an MRAM structure, comprising:

(a) providing a substrate comprised of a word line, word line pad, word line contact, and word line ILD layer that are coplanar;

(b) depositing a first SiNx layer on the substrate and forming an opening in said first $SiN_x$ layer that exposes the word line contact;

(c) sequentially depositing a bottom electrode layer, MTJ stack, and hard mask on the first SiNx layer and exposed portion of the word line contact;

(d) selectively removing portions of the hard mask and MTJ stack to form an MTJ element and overlying hard mask that are aligned above the word line;

(e) selectively removing portions of the bottom electrode layer to form an opening directly above the word line pad and directly above a bonding pad region thereby forming a bottom electrode below the MTJ element and on said word line contact;

(f) sequentially forming an MTJ ILD layer, second $SiN_x$ layer, and bit line ILD layer on the bottom electrode, hard mask, and first $SiN_x$ layer;

(g) forming a first trench in the second $SiN_x$ layer and bit line ILD layer above the word line pad, a second trench that exposes the hard mask on the MTJ element, a third trench above the bond pad region, and forming a via between the word line pad and first trench and between the bonding pad region and third trench; and (h) forming a bit line above the MTJ element, a bit line contact comprised of a dual damascene structure in the first trench and via above the word line pad, and a bit line contact comprised of a dual damascene structure in the third trench and via above the bonding pad region.

12. The method of claim 11 wherein the word line ILD layer, MTJ ILD layer, and bit line ILD layer are comprised of silicon oxide ($SiO_x$).

13. The method of claim 11 wherein the hard mask is comprised of Ta and has a thickness of about 200 to 500 Angstroms.

14. The method of claim 11 wherein the bottom electrode, MTJ stack, and hard mask are formed in a sputter deposition system.

15. The method of claim 11 wherein the MTJ element has shape anisotropy and a long axis and the bottom electrode has a rectangular shape with a lengthwise direction parallel to said long axis.

16. The method of claim 11 wherein the MTJ ILD layer is coplanar with said hard mask.

17. The method of claim 11 wherein the trenches and vias have sidewalls and bottoms and step (h) comprises the sequential deposition of a diffusion barrier layer and Cu seed layer on the sidewalls and bottoms of the vias and trenches and then a Cu ECP deposition to fill the vias and trenches.

18. The method of claim 17 further comprised of a CMP process after the Cu ECP deposition to remove the diffusion barrier layer and Cu layer above the bit line ILD layer and thereby form Cu damascene structures that are coplanar with the bit line ILD layer.

19. The method of claim 11 wherein portions of the hard mask, bottom electrode layer, and MTJ stack are selectively removed by ion beam etching.

20. The method of claim 11 wherein the word line pad, word line, and word line contact are comprised of Cu and a Cu—Cu junction is established between the word line pad and bit line contact.

* * * * *